(12) United States Patent
Kim et al.

(10) Patent No.: US 8,641,915 B2
(45) Date of Patent: Feb. 4, 2014

(54) ELECTRONIC DEVICE UTILIZING GRAPHENE ELECTRODES AND ORGANIC/INORGANIC HYBRID COMPOSITES AND METHOD OF MANUFACTURING THE ELECTRONIC DEVICE

(75) Inventors: Tae-Whan Kim, Seoul (KR); Won-il Park, Seoul (KR); Dong-Ick Son, Seoul (KR); Hee-Yeon Yang, Seoul (KR); Jung-Min Lee, Seoul (KR); Jae-Hun Jung, Seoul (KR)

(73) Assignees: Samsung Electronics Co., Ltd., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 483 days.

(21) Appl. No.: 12/860,553

(22) Filed: Aug. 20, 2010

(65) Prior Publication Data

US 2011/0041980 A1    Feb. 24, 2011

(30) Foreign Application Priority Data

Aug. 24, 2009    (KR) .................. 10-2009-0078052

(51) Int. Cl.
    *B44C 1/22*    (2006.01)
(52) U.S. Cl.
    USPC .............................. 216/37; 136/252; 428/220
(58) Field of Classification Search
    None
    See application file for complete search history.

(56) References Cited

U.S. PATENT DOCUMENTS

| | | | |
|---|---|---|---|
| 6,214,712 B1 * | 4/2001 | Norton | 438/591 |
| 2009/0071533 A1 * | 3/2009 | Choi et al. | 136/252 |
| 2009/0110627 A1 * | 4/2009 | Choi et al. | 423/447.1 |
| 2010/0087067 A1 * | 4/2010 | Seo et al. | 438/758 |
| 2010/0206361 A1 * | 8/2010 | Kim et al. | 136/252 |
| 2010/0319771 A1 * | 12/2010 | Mihailetchi et al. | 136/258 |
| 2011/0002970 A1 * | 1/2011 | Parashar | 424/401 |
| 2011/0253217 A1 * | 10/2011 | Grossman et al. | 136/263 |

FOREIGN PATENT DOCUMENTS

| | | |
|---|---|---|
| KR | 10-2009-0028007 | 3/2009 |
| KR | 2009-0025803 | 3/2009 |
| KR | 2009-0057205 | 6/2009 |
| WO | WO 2008/130431 | 10/2008 |

OTHER PUBLICATIONS

Berger,ultrathin transparent graphene films as alternative to metal oxide electrodes, Dec. 17, 2007, Nanotechnology Spotlight,p. 1-7.*
Wikepedia, Induction heating, 2013, Wikepedia, p. 1-5.*

(Continued)

*Primary Examiner* — Binh X Tran
*Assistant Examiner* — David Cathey, Jr.
(74) *Attorney, Agent, or Firm* — Harness, Dickey & Pierce, P.L.C.

(57) ABSTRACT

Example embodiments are directed to an electronic device and a method for manufacturing the same. The electronic device includes a polymer thin film and an electrode. The polymer thin film includes nanoparticles. The electrode is formed by attaching a graphene thin film of a sheet shape formed through graphene deposition using a vapor carbon supply source to the polymer thin film. In the method, a graphene thin film of a sheet shape is formed through graphene deposition using a vapor carbon supply source. A polymer solution with distributed nanoparticles is prepared. The polymer solution with distributed nanoparticles is spin-coated on a substrate. A polymer thin film comprising the nanoparticles is formed by drying the spin-coated polymer solution. An electrode is formed by attaching the graphene thin film onto the polymer thin film.

18 Claims, 8 Drawing Sheets

(56) References Cited

OTHER PUBLICATIONS

Kustov, Enthalpies and heat capacities of ethyl acetate solutions in water and in several organic solvents at 298-319 K, Jun. 1, 2012, J. Solution Chem, p. 1008-1012.*

Li, Enhanced ultraviolet emission from ZnO nanocrystals embedded in a hybrid polymer composite layer, Apr. 4, 2008, Journal of applied physics, 103, 073511, (five pages in total).*

Qian Liu et al., "Polymer Photovaltaic Cells Based on Solution-Processable Graphene and P3HT", Advance Functional Materials, vol. 19, 2009, pp. 894-904.

Xuan Wang et al., "Transparent, Conductive Graphene Electrodes for Dye-Sensitized Solar Cells", Nano Letters, vol. 8, Dec. 11, 2007, pp. 323-327.

Zunfeng Liu et al., "Organic Photovoltaic Devices Based on a Novel Acceptor Material: Graphene", Advanced Materials, vol. 20, 2008, pp. 3924-3930.

* cited by examiner

ELECTRONIC DEVICE UTILIZING GRAPHENE ELECTRODES AND ORGANIC/INORGANIC HYBRID COMPOSITES AND METHOD OF MANUFACTURING THE ELECTRONIC DEVICE

CROSS-REFERENCE TO RELATED APPLICATIONS

This U.S. non-provisional patent application claims priority under 35 U.S.C. §119 to Korean Patent Application No. 10-2009-0078052, filed on Aug. 24, 2009, the entire contents of which are hereby incorporated by reference.

BACKGROUND

Example embodiments relate to an electronic device and a method for manufacturing the same, and more particularly, to an electronic device which uses organic/inorganic hybrid composites as a memory layer, a photovoltaic layer, and a light emitting layer, and a method for manufacturing the same.

An amount of current used by memory devices when storing and reading information as charged may depend on the state of the stored charges. Electronic devices that convert electricity into light or converts light into electricity, for example, light emitting devices converting electricity into light, and solar cell and photodetectors converting light into electricity will be collectively referred to as electronic devices throughout the present disclosure.

Graphene is a material having a structure in which carbon atoms are two-dimensionally arranged like graphite. Unlike graphite, however, graphene is relatively thin and is formed of a single, two or three layers. Graphene is flexible, and has high electrical conductivity. Also, since graphene is relatively transparent, graphene may be used as transparent and flexible electrodes. Graphene may also be used as an electron transport material, like electron transport layers in electronic devices.

Recently, the use of graphene as electron transport layers and transparent electrodes of electronic devices using the photovoltaic principle that converts light into electricity like solar cells or photodetectors is increased. While Indium Tin Oxide (ITO) is being widely used as transparent electrodes of electronic devices, there are limitations to the use of ITO since the supplies of Indium (In) are lowering leading to increase in cost of In. Also, due to its lack of flexibility, it is difficult to use In in devices that bend or have sharp edges/corners.

Typical methods of manufacturing graphene thin film for transparent electrodes can be divided into methods for manufacturing thin film by purifying graphite using a catalyst, and wet methods using graphene oxide. A method of manufacturing graphene thin film by purifying graphite involves covering graphite adhered on a substrate with a catalyst, and then covering the result with high polymer and performing heat treatment to obtain graphene from graphite. Then, the substrate is removed, and a graphene thin film is obtained. A wet method using graphene oxide involves oxidizing graphene, mixing and diffusing it in a solution, followed by spin coating it to directly for in an electrode or electron transport layer.

Methods that purify graphite using a catalyst can obtain high-quality graphene thin film, but involve fairly complicated processes. Because the methods use typical high polymer processing such as spin coating, methods that use oxidized graphene are relatively simple processes, can easily form graphene thin films over large surface areas, and enable production of graphene thin film or configurations having other materials mixed therein such as graphene-high polymer compounds. Additionally, the methods are simpler than those in which graphite is purified. However, because oxidized graphene is used, the electrical characteristics are inferior to cases where purified graphene is used, and because thin film may be formed as separate small pieces instead of unified single thin film, the characteristics for a transparent electrode may be inferior to a typical ITO film.

Graphene formed through typical methods is mostly restricted to use in solar cells and transparent electrodes for light emitting devices. However, the use of graphene in other electronic devices such as photodetectors is limited. Also, the performance of graphene electrodes in solar cells and light emitting devices is relatively inferior as compared to ITO.

While research is underway to use compound organic and non-organic materials such as high polymer thin film including nano particles for memory layers of electronic devices, photovoltaic layers, or light emitting layers, typical methods are relatively complicated in terms of nano particle production, and there are limits to the applications because of limited types of nano particles available.

SUMMARY

According to example embodiments, an electronic device includes a polymer thin film including nanoparticles; and at least one electrode on the polymer thin film, the at least one electrode including a graphene thin film.

According to example embodiments, the electronic device further includes a bottom electrode on a substrate; a hole transport layer on the bottom electrode; and the polymer thin film including nanoparticles on the hole transport layer.

According to example embodiments, the electronic device further includes the polymer thin film including nanoparticles on a substrate; a hole transport layer on the polymer thin film; and at least two electrodes in parallel on the polymer thin film.

According to example embodiments, the substrate includes at least one of a transparent inorganic substrate including one of glass, quartz, Al2O3, and SIC, a transparent organic substrate including one of polyethylene terephthalate (PET), polystyrene (PS), polyimide (PI), polyvinyl chloride (PVC), polyvinyl pyrrolidone (PVP), and polyethylene (PE), and a substrate including one of Si, GaAs, InP, InSb, AlAs, AlSb, CdTe, ZnTe, ZnS, CdSe, CdSb, and GaP.

According to example embodiments, the bottom electrode is at least one of a transparent electrode including one of an ITO, a Al-doped ZnO (AZO), a Ga-doped ZnO (GZO), a Mg-doped ZnO (MGO), and a Mo-doped ZnO and a metal electrode including one of Al, Au, Cu, Pt, Ag, W, Ni, Zn, Ti, Zr, Hf, Cd, and Pd.

According to example embodiments, the bottom electrode is a graphene thin film.

According to example embodiments, the nanoparticles are at least one of a metal oxide and a carbonate, the metal oxide being one of ZnO, CuO, BaCO3, Bi2O3, CaCO3, CeO2, Cr2O3, Fe2O3, Ga2O3, In2O3, Li2CO3, LiCoO2, MgO, MnCO3, MnO2, Mn3O4, Nb2O5, PbO, Sb2O3, SnO2, SrCO3, Ta$_2$O$_5$, TiO2, BaTiO3, V2O5, WO3, and ZrO2, and the carbonate being one of BaCO3, CaCO3, Li2CO3, SrCO3, and MnCO3.

According to example embodiments, the polymer thin film is one of PVP, PS, polymethyl methacrylate (PMMA), poly-N-vinylcarbazole (PVK), and PI.

According to example embodiments, a photovoltaic device includes the electronic device.

According to example embodiments, a method for manufacturing an electronic device includes forming a graphene thin film of a sheet shape by graphene deposition using a vapor carbon supply source; preparing a polymer solution with distributed nanoparticles; spin-coating the polymer solution with distributed nanoparticles on a substrate; forming a polymer thin film including the nanoparticles by drying the spin-coated polymer solution; and forming a top electrode by attaching the graphene thin film to the polymer thin film.

According to example embodiments, forming the graphene thin film includes depositing graphene on a SiO2 substrate; and separating the SiO2 substrate and the graphene.

According to example embodiments, depositing the graphene on the SiO2 substrate includes supplying a $CH_4$ gas and a mixture of hydrogen and argon on the SiO2 substrate deposited with Ni.

According to example embodiments, in the separating of the SiO2 substrate and the graphene, graphene is extracted in a thin film form by sequentially dipping the SiO2 substrate deposited with the graphene in an HF solution and a Ni etchant, and etching SiO2 and Ni.

According to example embodiments, preparing the polymer solution with distributed nanoparticles includes forming a mixed solution by dissolving metal acetate dehydrate in N,N-Dimethylformamide (DMF); forming nanoparticles by reducing heating temperature after the mixed solution is heated; and forming a polymer solution by mixing a polymer material in the mixed solution including the nanoparticles.

According to example embodiments, the metal acetate dihydrate is a compound expressed as $M(CH_3COO)_2.2H_2O$, M being a metal and being one of Zn, Al, Ba, Bi, Ca, Ce, Cr, Fe, Ga, In, Li, Co, Mg, Mn, Nb, Pb, Sb, Sn, Sr, Ta, Ti, V, W, and Zr.

According to example embodiments, the nanoparticles are one of $ZnO$, $CuO$, $BaCO_3$, $Bi_2O_3$, $CaCO_3$, $CeO_2$, $Cr_2O_3$, $Fe_2O_3$, $Ga_2O_3$, $In_2O_3$, $Li_2CO_3$, $LiCoO_2$, $MgO$, $MnCO_3$, $MnO_2$, $Mn_3O_4$, $Nb_2O_5$, $PbO$, $Sb_2O_3$, $SnO_2$, $SrCO_3$, $Ta_2O_5$, $TiO_2$, $BaTiO_3$, $V_2O_5$, $WO_3$, and $ZrO_2$.

According to example embodiments, the substrate is a glass substrate, a bottom electrode including Indium Tin Oxide (ITO) is formed on the glass substrate, the nanoparticles include ZnO, and the polymer thin film includes poly-N-vinylcarbazole (PVK).

According to example embodiments, forming the graphene thin film includes placing a $SiO_2$ substrate including a graphite metal layer formed thereon in a chamber; heating the graphite metal layer by a heat transport effect when current flows in at least one of the graphite metal layer and the $SiO_2$ substrate in the chamber; depositing carbon ingredients on the graphite metal layer by supplying a vapor carbon supply source in the chamber when the graphite metal layer is heated; extracting graphene from the deposited carbon ingredients to a surface of the graphite metal layer by cooling the graphite metal layer at a controlled rate by adjusting the amount of current; and separating the extracted graphene from the $SiO_2$ substrate by removing the graphite metal layer by an acid treatment.

According to example embodiments, the vapor carbon supply source comprises a $CH_4$ gas.

According to example embodiments, hydrogen is further supplied along with the vapor carbon supply source.

According to example embodiments, a heating temperature of the graphite metal layer ranges from about 600° C. to about 1,000° C. while the vapor carbon supply source is supplied.

According to example embodiments, a cooling speed of the graphite metal layer ranges from about 1° C. to about 50° C. per second while the graphene is extracted.

According to example embodiments, the graphite metal layer is at least one selected from the group consisting of Ni, Co, Fe, Pt, Au, Al, Cr, Cu, Mg, Mn, Mo, Rh, Si, Ta, Ti, W, U, V, and Zr.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
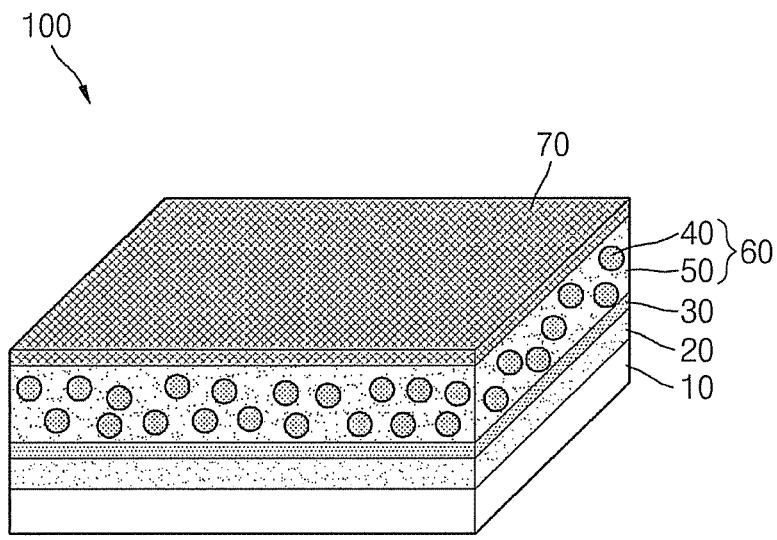
FIG. 1 is a perspective view illustrating an organic/inorganic hybrid composite electronic device utilizing graphene according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view illustrating an organic/inorganic hybrid composite electronic device including graphene, according to example embodiments. The electronic device according to example embodiments may include graphene as transparent electrodes and may include organic/inorganic hybrid composites.

Referring to FIG. 1, an electronic device 100 according to example embodiments may include a bottom electrode 20 on a substrate 10, a hole transport layer 30, a composite layer 60 formed of a polymer thin film 50 with nanoparticles 40, and a top electrode 70. According to example embodiments, the hole transport layer 30 may be omitted, and other layers, for example, an electron transport layer may be disposed between the composite layer 60 and the top electrode 70. The top electrode 70 may be formed by adhering a graphene thin film of a sheet shape obtained by a graphene deposition using a vapor carbon supply source to a polymer thin film 50.

Figure 2:
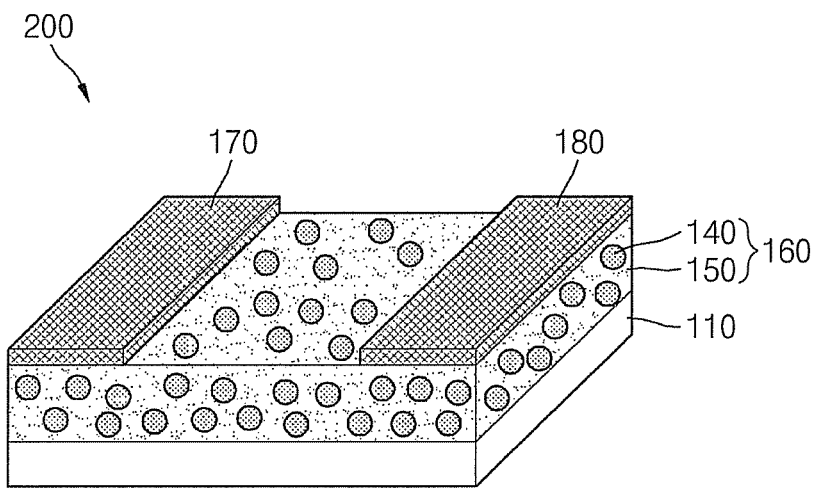
FIG. 2 is a perspective view illustrating another electronic device according to example embodiments.

FIG. 2 is a perspective view illustrating another electronic device, according to example embodiments.

Referring to FIG. 2, an electronic device 200 according to example embodiments may include a substrate 100, a composite layer 160 including a polymer thin film 150 with nanoparticles 140, and first and second electrodes 170 and 180 over the polymer thin film 150. Here, a hole transport layer like the hole transport layer 30 of FIG. 1 may be disposed between the substrate 110 and the composite layer 160. Similarly, other layers may be further disposed between the respective layers. The first and second electrodes 170 and 180 may also be formed by adhering a graphene thin film of a sheet shape obtained by a graphene deposition using a vapor carbon supply source to a polymer thin film 150.

According to example embodiments, the electronic device 200 may be manufactured by initially manufacturing an electronic device somewhat similar to electronic device 100 of the example embodiment of FIG. 1 followed by patterning, for example, the top electrode 70 to form the first and second electrodes 170 and 180 over the polymer thin film 150. For example, patterning of the top electrode 70 may include selectively etching the top electrode 70 to form the first and second electrodes 170 and 180.

The electronic devices according to example embodiments may be implemented as a vertical device in which the organic/inorganic composite layer 60 is disposed between the bottom electrode 20 and the top electrode 70 stacked over the substrate 10 like in FIG. 1, and electrons move in a direction vertical to the substrate 10, or a planar device in which the first electrode 170 and the second electrode 180 are parallelly disposed on the composite layer 160 stacked over the substrate 110, and electrons are moved parallelly to the substrate 110.

Also, since the electronic devices according to example embodiments may be implemented as memory devices, solar cells, photodetectors, and/or light emitting devices through material selection in consideration of Fermi levels of each layers forming the electronic device and changes of circuit configuration for proper electrical operation, the composite layers 60 and 160 including the polymer thin films 50 and 150 with nanoparticles 40 and 140 may serve, for example, as a memory layer of a memory device, a photovoltaic layer of a photodetector and a solar cell, and a light emitting layer of a light emitting device.

The substrates 10 and 110 may include a transparent inorganic substrate such as glass, quartz, $Al_2O_3$, and SiC, a transparent organic substrate such as polyethylene terephthalate (PET), polystyrene (PS), polyimide (PI), polyvinyl chloride (PVC), polyvinyl pyrrolidone (PVP), and polyethylene (PE), or a substrate such as Si, GaAs, InP, InSb, AlAs, AlSb, CdTe, ZnTe, ZnS, CdSe, CdSb, and GaP. Alternatively, the substrates 10 and 110 may be formed of materials such as paper and vinyl because a manufacturing method according to example embodiments does not require a high temperature process as described below.

The bottom electrode 20 of FIG. 1 may be a transparent electrode including, for example, ITO, Al-doped ZnO (AZO), Ga-doped ZnO (GZO), Mg-doped ZnO (MGO), and Mo-doped ZnO or a metal electrode including, for example, Al, Au, Cu, Pt, Ag, W, Ni, Zn, Ti, Zr, Hf, Cd, and Pd. Alternatively, a graphene thin film of a sheet shape, as mentioned above, which is manufactured through a graphene deposition using a vapor carbon supply source may also be used.

The composite layers 60 and 160 of FIGS. 1 and 2 may be organic/inorganic composite materials, and may be formed of the polymer thin films 50 and 150 including the nanoparticles 40 and 140. Herein, the nanoparticles 40 and 140 may be formed of metal oxide or carbonate. The metal oxide may be one of ZnO, CuO, $BaCO_3$, $Bi_2O_3$, $CaCO_3$, $CeO_2$, $Cr_2O_3$, $Fe_2O_3$, $Ga_2O_3$, $In_2O_3$, $Li_2CO_3$, $LiCoO_2$, MgO, $MnCO_3$, $MnO_2$, $Mn_3O_4$, $Nb_2O_5$, PbO, $Sb_2O_3$, $SnO_2$, $SrCO_3$, $Ta_2O_5$, $TiO_2$, $BaTiO_3$, $V_2O_5$, $WO_3$, and $ZrO_2$, and the carbonate may be one $BaCO_3$, $CaCO_3$, $Li_2CO_3$, $SrCO_3$, and $MnCO_3$. The polymer thin film 50 and 150 may be formed of at least one of PVP, PS, polymethyl methacrylate (PMMA), poly-N-vinylcarbazole (PVK), and PI.

The top electrode 70 of FIG. 1, and the first and second electrodes 170 and 180 of FIG. 2, which are transparent electrodes, may be formed of a graphene thin film of a sheet shape manufactured through graphene deposition using a vapor carbon supply source, according to example embodiments.

Since the graphene is transparent, incident light may pass through both upper and lower ends of the electronic devices 100 and 200 when the substrate substrates 10 and 110 and the bottom electrode 20 are fainted of transparent substrates and transparent electrodes such as glass and/or ITO. Accordingly, since the amount of the incident light increases, the efficiency of the electronic device increases, for example, when the electronic devices are used in solar cells and/or photodetectors.

Figure 3:
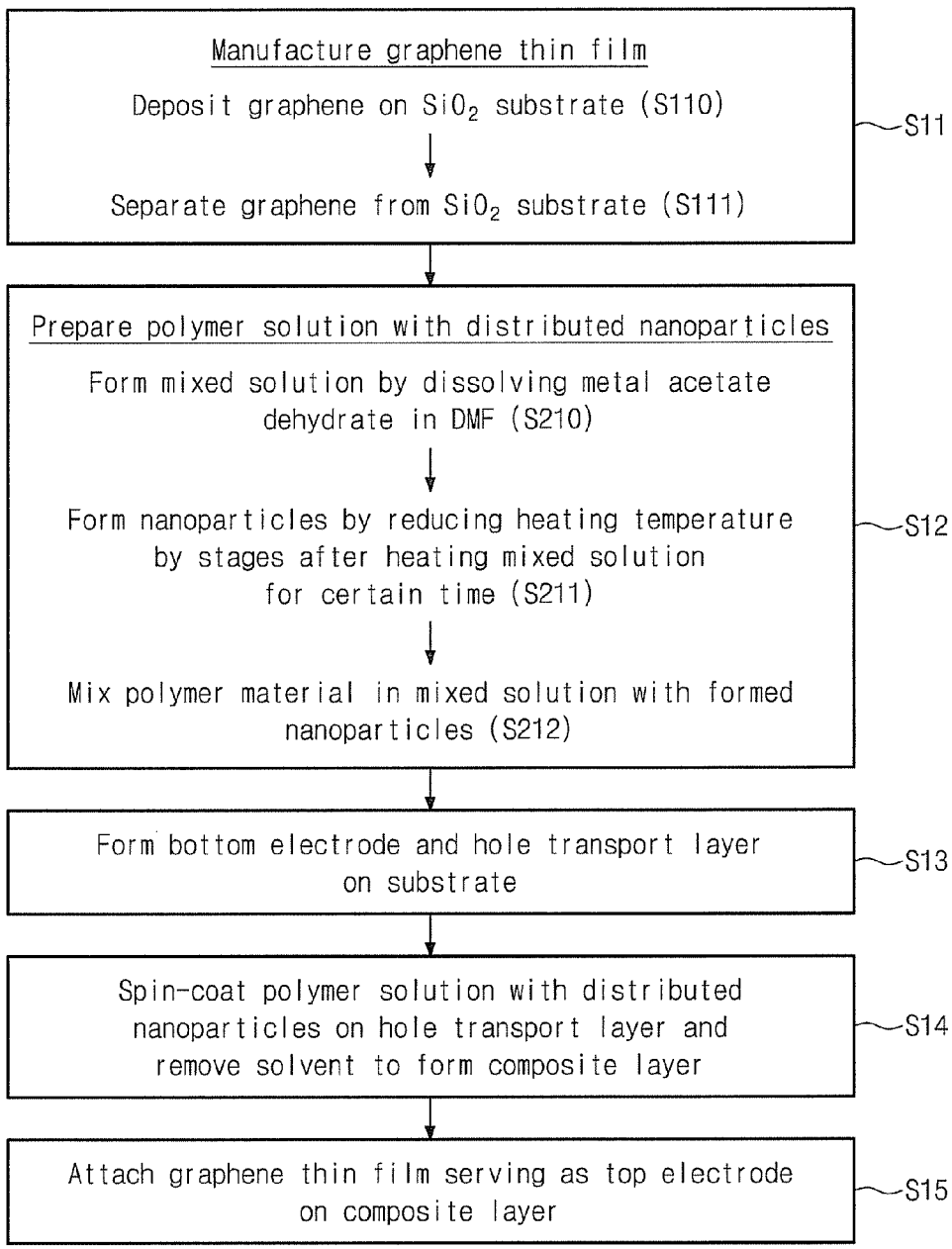
FIG. 3 is a flowchart illustrating a method for manufacturing an electronic device according to example embodiments.
Figure 4A:
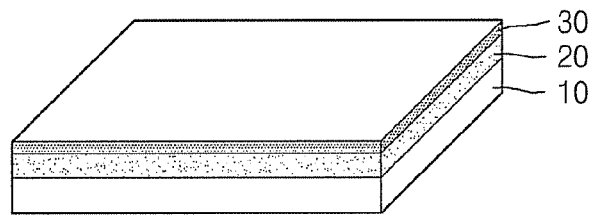
FIGS. 4A through 4C are perspective views illustrating the method of FIG. 3.
Figure 4B:
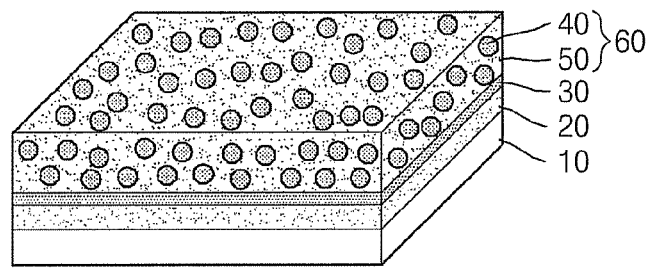
Figure 4C:
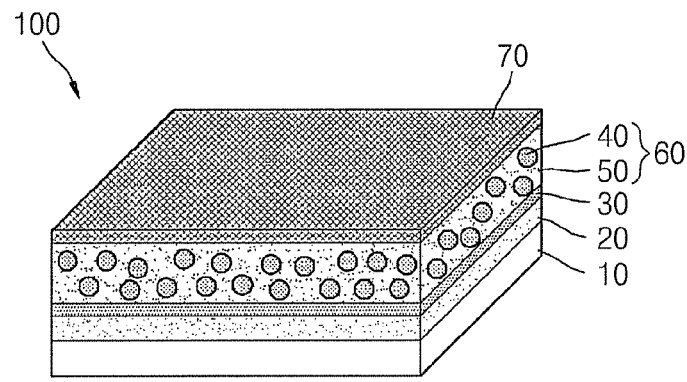

FIG. 3 is a flowchart illustrating a method for manufacturing an electronic device according to example embodiments. FIGS. 4A through 4C are perspective views illustrating a process of FIG. 3. Hereinafter, a method for manufacturing the electronic device of FIG. 1 will be described in detail with reference to FIGS. 3, 4A though 4C.

In operation S11, a graphene thin film of a sheet shape is manufactured to be used as a transparent electrode.

In operation S110, graphene is deposited on a $SiO_2$ substrate. According to example embodiments, the $SiO_2$ substrate deposited with Ni is placed in a chemical vapor deposition chamber, and then hydrogen and argon gases are filled in an appropriate ratio, for example, a ratio of about 1:4. While maintaining at a desired air pressure, a vapor carbon supply source, for example, $CH_4$ gas and hydrogen-argon mixture is introduced for a desired duration at a high temperature, for example, about 30 seconds, and then is slowly cooled to a normal temperature (for example, room temperature). As a result, graphene is grown on Ni.

In operation S111, the grown graphene is separated from the $SiO_2$ substrate. According to example embodiments, the SiO2 substrate is sequentially dipped in an HF solution and a Ni etchant to etch SiO2 and Ni to completely separate graphene from the SiO2 substrate in a thin film form. A TFB or TFG solution may be used as a Ni etchant, for example.

In operation S12, a polymer solution with distributed nanoparticles is prepared.

In operation S210, a mixed solution is formed by dissolving metal acetate dihydrate in N,N-Dimethylformamide (DMF).

The metal acetate dihydrate is a compound that may be expressed as $M(CH_3COO)2.2H2O$ (M is metal). The metal may be one of Zn, Al, Ba, Bi, Ca, Ce, Cr, Fe, Ga, In, Li, Co, Mg, Mn, Nb, Pb, Sb, Sn, Sr, Ta, Ti, V, W, and Zr.

In operation S211, the mixed solution is heated, and then the heating temperature is reduced in stages (for example, gradually) to form nanoparticles. The heating temperature may be a relatively low temperature of about 100° C. to form nanoparticles. After heating, it is necessary to reduce the heating temperature in stages (for example, gradually) and avoid rapid cooling. Herein, the formed nanoparticles may be formed of metal oxide or carbonate. The nanoparticles may be one of ZnO, CuO, $BaCO_3$, $Bi_2O_3$, $CaCO_3$, $CeO_2$, $Cr_2O_3$, $Fe_2O_3$, $Ga_2O_3$, $In_2O_3$, $Li_2CO_3$, $LiCoO_2$, MgO, $MnCO_3$, $MnO_2$, $Mn_3O_4$, $Nb_2O_5$, PbO, $Sb_2O_3$, $SnO_2$, $SrCO_3$, $Ta_2O_5$, $TiO_2$, $BaTiO_3$, $V_2O_5$, $WO_3$, and $ZrO_2$. A ratio of DMF and metal acetate dihydrate, heating temperature, and heat duration may be adjusted to change the density and size of the formed nanoparticles. In operation S212, a polymer solution may be formed by evenly mixing a polymer material in a mixed solution with the formed nanoparticles.

In operation S13, the bottom electrode 20 is formed on the substrate 10 to manufacture the electronic device 100 having the structure of FIG. 1, and PEDOT:PSS thin film serving as the hole transport layer 30 is formed through spin coating as shown in FIG. 4A.

In operation S14, the polymer solution with distributed nanoparticles is spin-coated on the hole transport layer 30. When the spin coated polymer solution is heated to remove solvent, the polymer thin film 50 including nanoparticles 40 may be generated to form the composite layer 60 as shown in FIG. 4B.

In operation S15, the graphene thin film manufactured in the preceding operation(s) is attached to the composite layer 60 to form the top electrode 70 as shown in FIG. 4C, and then an external circuit (not shown) is connected to the electronic device 100.

The manufacturing process of the electronic device 200 shown in FIG. 2 may be somewhat similar to that of the electronic device 100 shown in FIG. 1. However, there is a difference in that, the bottom electrode 20 is absent and the first and second electrodes 170 and 180 are formed of a graphene thin film of a sheet shape manufactured through graphene deposition on the polymer thin film 150 using a vapor carbon supply source.

In the electronic devices according to example embodiments, layers of organic/inorganic hybrid composites may be formed through a relatively simple process, and graphene may be directly used as electrodes. Since graphene of a sheet shape manufactured through graphene deposition using a vapor carbon supply source may be attached on a polymer thin film including nanoparticles without a separate process, a drawback of diffusion of metal impurities into the polymer thin film, which may be possible in a typical metal electrode forming process, may not occur, thereby achieving superior electrical characteristics. Also, since graphene serves as a transparent electrode in the electronic devices according to example embodiments, it is not necessary to use inorganic transparent electrodes such as transparent substrates and ITO in the manufacture of the electronic devices. In addition, when solar cell and/or photodetectors include a transparent substrate, both sides of the solar cells and/or photodetectors can receive light, thereby increasing their utilization.

According to example embodiments, the electronic device 100 of FIG. 1 may include the top electrode 70 of a graphene thin film of a sheet shape manufactured through graphene deposition using a vapor carbon supply source. However, the graphene thin film may also be used as the bottom electrode 20 by attaching the graphene thin film of a sheet shape manufactured through graphene deposition using a vapor carbon supply source to the substrate 10.

Also, as per example embodiments, graphene is grown on a $SiO_2$ substrate deposited with Ni to form a graphene thin film, but the substrates are not limited to the SiO2 substrate and a variety of substrates may be used as a base material for forming the graphene film. The growth of the graphene may be performed through a typical CVD process, but a higher quality of graphene thin film can be obtained by a method described below to improve the quality of electronic devices using the graphene thin film, for example, as electrodes.

Figure 5:
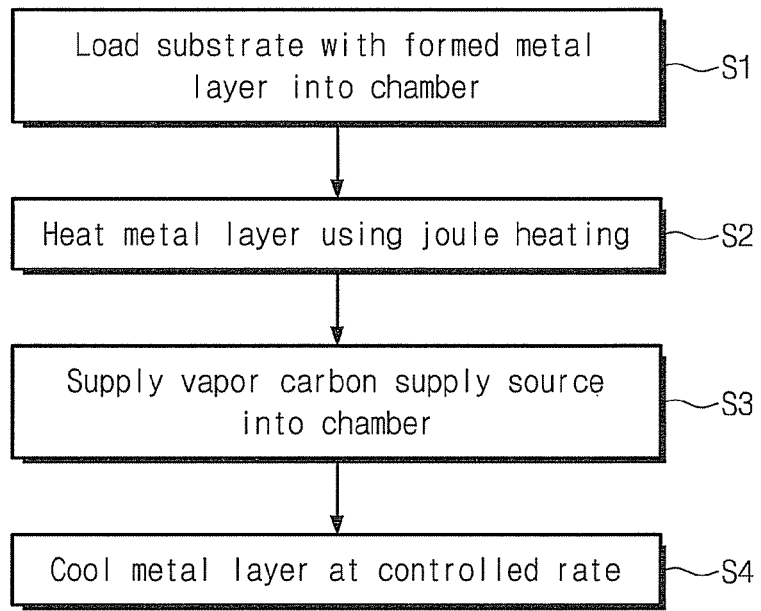
FIG. 5 is a flowchart illustrating a process of manufacturing a graphene thin film according to example embodiments.
Figure 6:
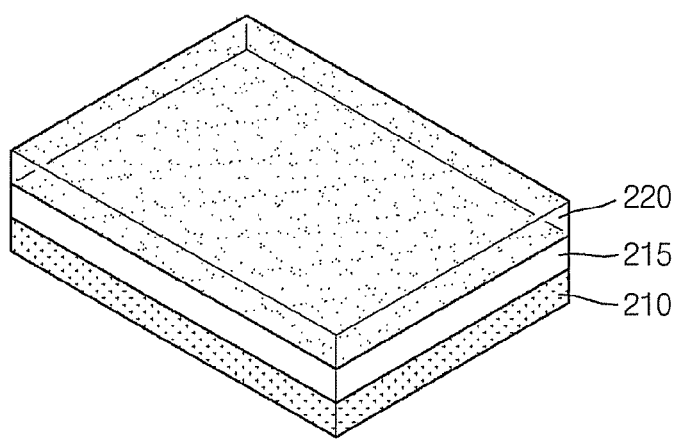
FIGS. 6 and 8 are perspective views illustrating the method according to the flowchart of FIG. 5.
Figure 7:
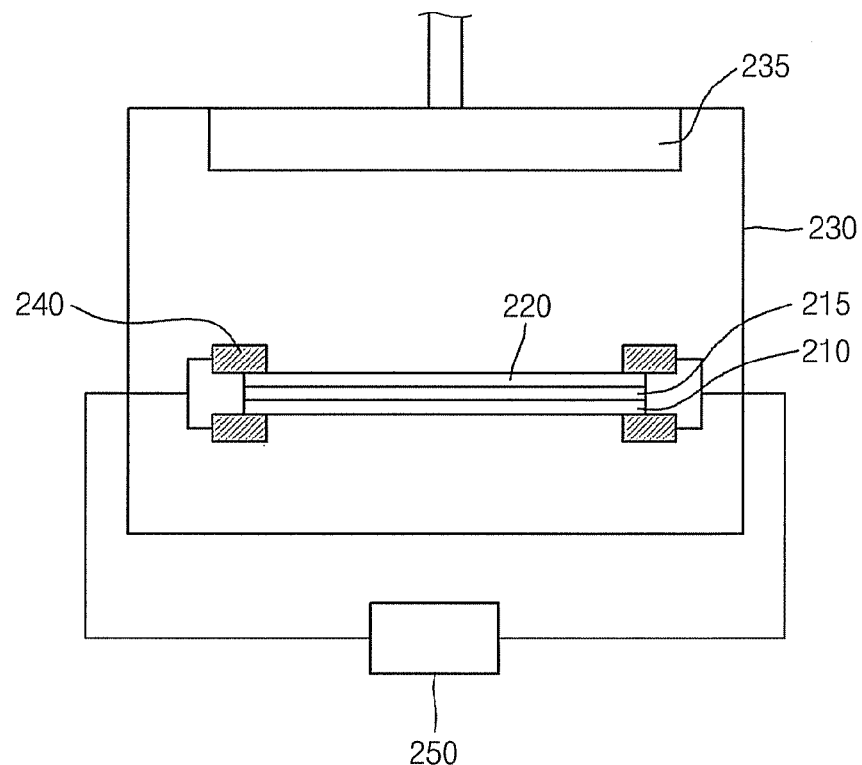
FIG. 7 is a cross-sectional view of chamber used in the method according to the flowchart of FIG. 5.
Figure 8:
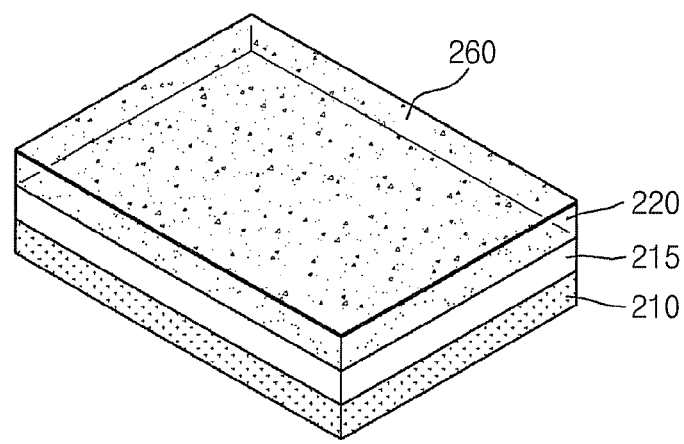

FIG. 5 is a flowchart illustrating a process of manufacturing a graphene thin film according to example embodiments. FIGS. 6 and 8 are perspective views illustrating a process according to the flowchart of FIG. 5. FIG. 7 is a cross-sectional view of a chamber utilized in the process according to the flowchart of FIG. 5.

In operation S1, a graphite metal layer 220 is prepared on a substrate 210 as shown in FIG. 6, and placed in a chamber 230 as shown in FIG. 7. The substrate 210 may be a substrate somewhat similar to substrates 10 and 110.

The chamber 230 may include a gas feeder 235 that can supply various gases to the substrate 210 in a CVD process. The gas feeder 235 may be configured with a shower head that is used as a typical gas feeder, but example embodiments are not limited thereto. After the substrate formed with the graphite metal layer 220 is placed in the chamber 230, air in the chamber 230 is removed by, for example, a pump (not shown). Then, while maintaining a vacuum state, a mixture of hydrogen and argon gases having a ratio of about 1:1 to about 1:6 may be introduced to maintain a normal pressure.

The substrate 210 is such that it may endure a heating temperature of about 1,000° C. in a subsequent process, and may be formed of a material that can easily be removed by an acid treatment to separate a graphene thin film of a sheet shape therefrom. A doped or undoped silicon substrate may be used as the substrate 210. However, example embodiments are not limited thereto and any material that satisfies the above requirements may be used. As illustrated in FIG. 7, silicon oxide 215 may be disposed on the silicon substrate, and a graphite metal layer 220 may be disposed thereon.

The graphite metal layer 220 may be a layer including a graphite metal catalyst that may allow carbon atoms to combine with each other to form a planar structure having a hexagonal shape. For example, the graphite metal catalyst may include catalysts used in synthesizing graphite, inducing carbonizing reaction, and/or manufacturing carbon nanotube. More specifically, the graphite metal catalyst may include one or more metals or alloys selected from the group consisting of Ni, Co, Fe, Pt, Au, Al, Cr, Cu, Mg, Mn, Mo, Rh, Si, Ta, Ti, W, U, V, and Zr.

The graphite metal layer 220 may be formed by dissolving a complex or alkoxide of such a metal in a solvent such as alcohol, and then spreading it on the substrate 210 and drying it. Alternatively, the graphite metal layer 220 may also be formed by depositing on the substrate 210 through a metal deposition method such as thermal deposition.

Electrodes 240 may be installed on both ends of the substrate 210 in the chamber 230. The electrodes 240 may be connected to a power source (direct current or alternating current) external to the chamber 230. As shown in FIG. 7, the electrodes 240 may contact the substrate 210 with the graphite metal layer 220. When the substrate 210 is non-conductive, for example, an undoped silicon substrate, current may flow through the graphite metal layer 220, and when the substrate 210 is conductive, for example, a doped silicon substrate, current may flow through at least one of the graphite metal layer 220 and the substrate 210. The electrodes 240 shown in FIG. 7 may be two pairs of electrodes extending along two sides of the substrate 210 opposite to each other at the both upper and lower ends of the substrate 210, but embodiments are not limited thereto. For example, any structure that allows the graphite metal layer 220 and/or the substrate 210 to be applied with an electric current may be used.

In operation S2, the graphite metal layer 220 is heated by a heat transfer effect by allowing a current to flow in at least one of the graphite metal layer 220 and the substrate 210 in the chamber 230 under a normal pressure. For example, the temperature of the graphite metal layer 220 may be increased by a joule heating method. The temperature may be increased to about 600° C. to about 1,000° C. Due to this heating effect, the particle size of the graphite metal layer 220 may increase, and the surface of the graphite metal layer 220 may be flattened.

As describe above, electric current is fed to the graphite metal layer 220 and/or the substrate 210 by contacting the electrodes 240 of the chamber 230 with the graphite metal layer and/or substrate 210. In this case, the heat transfer effect may heat the graphite metal layer 220. When the substrate 210 is non-conductive, application of an electric current to the graphite metal layer 220 may directly generate heat to increase its temperature. Since the metal catalyst is formed in a layer shape, and the electrodes 240 contact both ends of the substrate 210, a current may evenly flow over the whole surface of the graphite metal layer 220. Thus, the whole of the graphite metal layer 220 may be almost evenly heated by the heat transfer effect without requiring a complex control, by allowing a current to flow in the graphite metal layer 220. When the substrate 210 is conductive, application of an electric current to the substrate 210 may allow the substrate 210 to generate heat, and the graphite metal layer 220 thereon may easily be heated.

In this process, the size of the metal particles forming the graphite metal layer 220 may increase due to an additional effect by an electric field formed by the flowing current as well as the heat effect, and thus the surface of the graphite metal layer 220 may be flattened. In a subsequent process, graphene may be formed over the flattened graphite metal layer 220, thereby improving the quality.

In operation S3, carbon ingredients are deposited/dissolved in the graphite metal layer 220 by supplying a vapor carbon supply source to the chamber 230 through the gas feeder 235 when the graphite metal layer 220 is heated.

The vapor carbon supply source may include hydrocarbon gases such as ethane, ethylene, ethanol, acetylene, propane, propylene, butane, butadiene, pentane, and hexane. Particularly, the vapor carbon supply source may include a $CH_4$ gas, and hydrogen may be further supplied along with the vapor carbon supply source. That is, while a mixture of hydrogen-argon is continuously supplied to maintain a nominal temperature of the chamber 230, a $CH_4$ gas as a vapor carbon supply source may be supplied in the above process. It is possible to adjust the amount of the carbon ingredients dissolved in the graphite metal layer 220 by controlling the heating temperature and time and the supply quantity of the vapor carbon supply source in the above process. When the amount of the dissolved carbon ingredients is increased by increasing the time and supply quantity, the thickness of the graphene thin film may be increased. When the amount of the dissolved carbon ingredients is reduced by reducing the time and supply quantity, the thickness of the graphene thin film may be reduced. When time is lengthened for a small supply quantity, a desired amount of carbon ingredients may be dissolved.

In a conventional treatment of a substrate requiring heating, methods for indirectly heating a substrate using a resistance heater or a radiant heat of a lamp are used. Recently, due to increase in size of thin film displays and/or increase in demand of cost-saving solar cell panels, graphene thin films are also increasing in size. In order to obtain such a large-sized graphene thin film, the substrate 210, as a base material in which a graphene thin film is formed also needs to be increased in size. However, typical methods for indirectly heating a substrate using a resistance heater or a radiant heat of a lamp have a limitation in that the manufacturing cost may increase because the sizes of the heater, the lamp and the like need to be increased.

However, since the substrate 210 and/or the graphite metal layer 220 are directly heated through a joule heating method by application of an electric current, it is possible to efficiently heat by a simple configuration, and the manufacturing cost may not increase. Also, it is possible to heat the graphite metal layer 220 when the substrate either nonconductive or conductive.

In operation S4, graphene is extracted to the surface of the graphite metal layer 220 from the carbon ingredients dissolved in the graphite metal layer 220 to form a graphene layer 260 as shown in FIG. 8, by stopping the supply of the vapor carbon supply source and reducing the amount of current to cool the graphite metal layer 220 at a controlled speed.

The above cooling process is an important process for obtaining a high-quality graphene layer 260 by evenly extracting graphene. A rapid cooling may not result in a desired thickness or may result in cracks in the generated graphene thin film. On the other hand, very slow cooling may cause excessive thickness of the graphene, and therefore may reduce production. Accordingly, it is desirable to cool at a controlled constant speed. An ideal cooling speed may be a cooling speed of about 1° C. to about 50° C. per second, and the most ideal cooling speed may be a cooling speed of about 10° C. per second.

A typical cooling after layer formation may be performed by a method of flowing inert gases and/or a natural cooling method. However, since the radiant heat may be controlled by adjusting the amount of current, the cooling speed of the graphite metal layer 220 may be well controlled to grow a high-quality graphene.

The graphene thin film 260 may be separated from the substrate 210 by removing the graphite metal layer 220 through an acid treatment. In example embodiments, when the substrate 210 formed with the graphene thin film 260 is sequentially dipped in a HF solution and a TFG solution, the silicon oxide 215 and the graphite metal layer 220 may be sequentially removed to completely separate the graphene thin film 260 of a sheet shape from the substrate 210. The graphene thin film 260 separated from the substrate 210 may be used as the top electrode 70 of the device of FIG. 1 and the first and second electrodes 170 and 180 of the devices of FIG. 2, for example.

Example Embodiments of Photodetector and Manufacturing Method

A. Method of Manufacturing a Graphene Thin Film

1) A $SiO_2$ substrate was washed using DI-water after performing an ultrasonic treatment with acetone and ethanol. The washed substrate was dried with an $N_2$ gas, and a Ni thin film of about 200 nm or more was deposited on the substrate.

2) After the $SiO_2$ substrate deposited with Ni was put into a chamber for CVD, and a vacuum was created in the chamber, a mixture of hydrogen and argon having a ratio of about 1:4 was introduced in the chamber at a normal pressure. After the temperature was increased to about 800° C. with the normal pressure maintained, a $CH_4$ gas and the mixture of hydrogen and argon was allowed to flow at about 50 sccm and about 200 sccm per second, respectively, and then cooled to a normal temperature at a rate of about 10° C. per second.

3) Graphene was grown on Ni through the above process. After the substrate with the grown graphene was dipped in TFG solution to etch SiO2, and then the substrate was dipped in TFG solution to etch Ni. As a result, only a graphene thin film was finally extracted. The extracted graphene thin film had a sheet shape. The extracted graphene thin film was kept in DI water to use in manufacture of a photodetector.

B. Method of Manufacturing ZnO Nanoparticles

1) In order to dissolve zinc acetate dihydrate [(Zn$(CH_3COO)_2H_2O$)], which is a precursor of ZnO, DMF solution was mixed at a ratio of about 1 g:100 mL. In this case, an ultrasonic stirrer was used for even mixing in order to completely dissolve it in solvent. Specifically, the mixed solution was evenly mixed for about 10 minutes using the ultrasonic stirrer.

2) DMF solution of the process 1 was heated to a temperate of about 105° C. Thereafter, the temperature was progressively reduced in the order of 80° C., 60° C., and 40° C. Specifically, after the mixed solution was heated at about 105° C. for five hours, the heating temperature was reduced by stages (for example, gradually) while the temperature was maintained at temperatures of 80° C., 60° C., and 40° C. for an hour.

3) As a result of the above process, ZnO nanoparticles were formed in the mixed solution. It is necessary to exactly control the temperature of the process 2 to obtain ZnO nanoparticles having excellent crystallinity.

C. Method of Manufacturing a Photodetector

1) A photodetector was manufactured to have a structure of FIG. 1. First, the surface of a glass substrate was chemically treated, and then an ITO, which is a transparent electrode, was deposited as a bottom electrode on the treated glass substrate through a sputtering process. When a silicon substrate was used instead of a transparent substrate like glass, a metal having a high work function like Au and Pt was deposited.

2) A PEDOT:PSS thin film serving as a hole transfer layer was formed on the substrate deposited with the bottom electrode.

3) After about 5 mL DMF solution with distributed ZnO nanoparticles manufactured in the process B was mixed in PVK at a ratio of about 0.5 wt %, the solution was evenly mixed by an ultrasonic stirrer for about 10 minutes to form a polymer solution.

4) After the PVK solution including the ZnO nanoparticles manufactured in the process 3 was raised on the PEDOT:PSS thin film through spin coating for about 10 to about 20 seconds at a rate of about 1,000 to about 2,000 µm, it was heated in an oven or a hotplate at a temperature of about 100° C. for about 30 minutes to form a thin film by evaporating solvent. The thickness of formed photovoltaic layer and the density of the ZnO nanoparticles is controlled by adjusting the rotation speed, and the concentration ratio of DMF and PVK upon spin coating.

Figure 9:
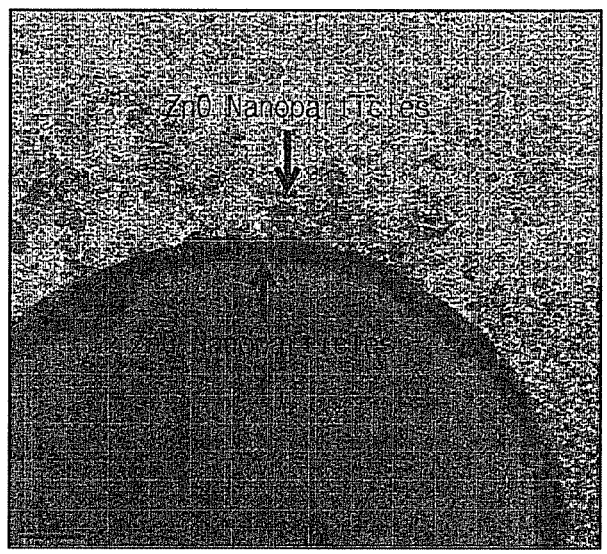
FIG. 9 is a cross-sectional Transmission Electron Microscope (TEM) photo illustrating a poly-N-vinylcarbazole (PVK) thin film with distributed ZnO particles, which is used a photovoltaic layer in a photodetector manufactured according to example embodiments.

FIG. 9 is a cross-sectional Transmission Electron Microscope (TEM) photo illustrating a poly-N-vinylcarbazole (PVK) thin film with distributed ZnO particles, which is used a photovoltaic layer in a photodetector manufactured according to example embodiments. In the process of forming a thin film, the ZnO nanoparticles may be fixed in a fog in of surrounding PVK as shown in FIG. 9.

Figure 10:
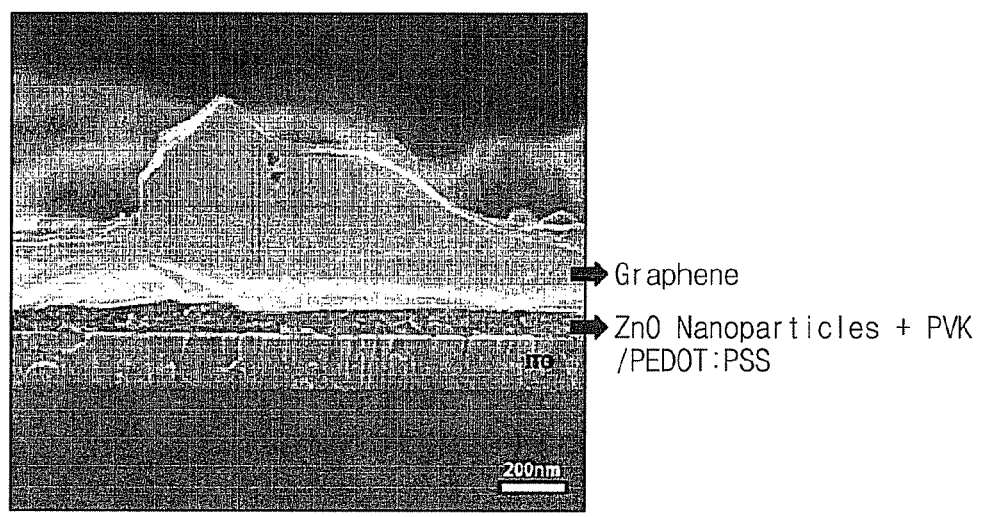
FIG. 10 is a cross-sectional TEM photo illustrating a photodetector according to example embodiments.

5) The graphene thin film manufactured in the process A was put up on the PVK thin film. The graphene thin film attached with relative ease to the PVK thin film by van der Waals forces. It was verified that the adhesive strength to the PVK thin film was relatively strong. FIG. 10 is a cross-sectional TEM photo illustrating a photodetector according to example embodiments. It was verified that a complete adhesion between the graphene thin film and the PVK thin film was achieved.

6) A photodetector was completed by connecting an external circuit.

D. Current-Voltage Characteristic when an External Light Source is Incident on a Photodetector Manufactured According to Example Embodiments FIG. 11 is a graph illustrating a voltage-current relation of a conventional photodetector with respect to a photodetector manufactured according to example embodiments.

Figure 11:
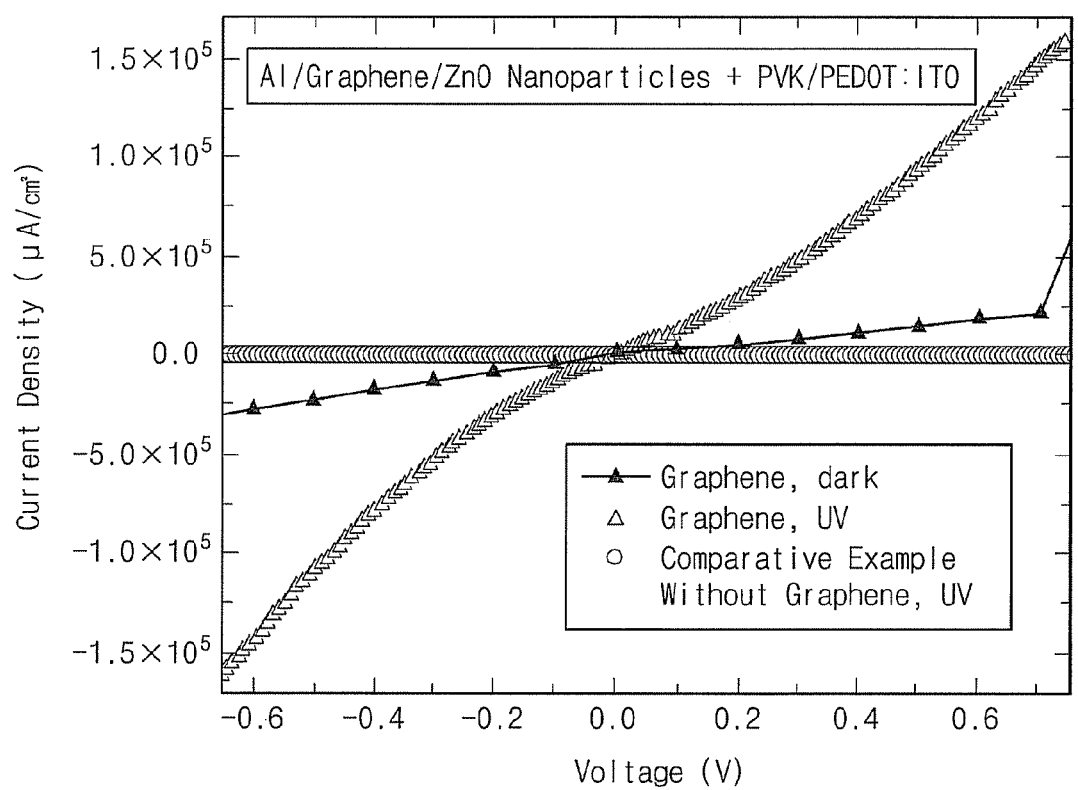
FIG. 11 is a graph illustrating a voltage-current relation of a comparative photodetector with respect to a photodetector manufactured according to example embodiments.

Referring to FIG. 11, there are shown the current-voltage characteristic)(°) of a photodetector manufactured according to example embodiments when ultraviolet light is incident, the current-voltage characteristic (-▲-) of a photodetector manufactured according example embodiments when ultraviolet light is not incident, and the current-voltage characteristic (o) of a conventional photodetector using an Al electrode instead of graphene when ultraviolet light is incident.

As shown in FIG. 11, in the case of a photodetector using an Al electrode instead of graphene, a current may not flow even when ultraviolet rays are incident. The photodetector using an Al electrode may have the same structure as a photodetector using graphene except for the electrodes. When Al is used as electrodes, a current does not flow because an interfacial resistance is considerably high due to a PVK damage by heat generated during heat deposition of Al electrode and an impurity formation by diffusion of Al into polymer.

When ultraviolet light is incident on a photodetector manufactured according to example embodiments, a relatively higher current flows than in the case where an Al electrode is used. When ultraviolet light is interrupted, the magnitude of current may be significantly reduced. As a result, it can be verified that the photodetector manufactured according to example embodiments may be a more efficient photodetector.

As shown in FIG. 11, the current of the photodetector manufactured according to example embodiments when ultraviolet light is interrupted is larger than the current of the photodetector using the Al electrode when ultraviolet light is incident. Accordingly, the interfacial resistance between the PVK and the graphene electrode is much smaller than the interfacial resistance between the PVK and the Al electrode. It can be verified that the graphene electrode used in a photodetector using organic/inorganic hybrid composites may provide a superior product.

E. Operation Principle of a Photodetector Manufactured According to Example Embodiments FIGS. 12 and 13 are cross-sectional views illustrating an operation principle of a photodetector manufactured according to example embodiments.

Figure 12:
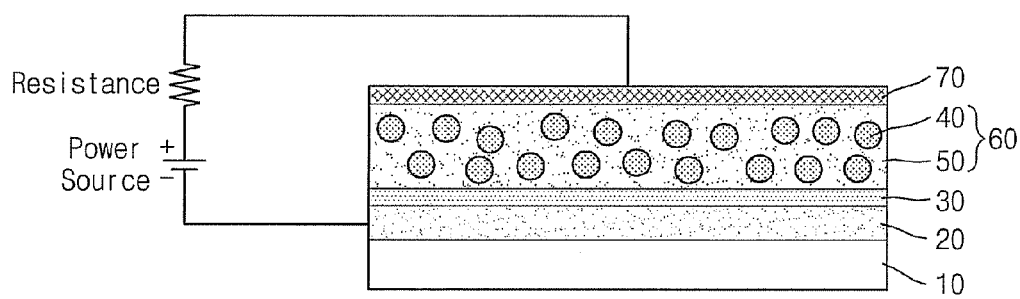
FIGS. 12 and 13 are cross-sectional views illustrating an operation principle of a photodetector manufactured according to example embodiments.

An external power source may be connected as shown in FIG. 12. The negative terminal of the power source (for example, cathode) may be connected to a bottom electrode 20, and the positive terminal of the power source (for example, anode) may be connected to a top electrode 70.

When an external light source is absent like in FIG. 12, a current does not flows as shown in FIG. 11. Since external light is not incident on nanoparticles 40, generation of excess carriers by electron-hole pairs does not occur in the nanoparticles 40 and the resistance of a photodetector is relatively large. Accordingly, a current may not flow in a load resistance, and the photodetector may enter off-state.

Figure 13:
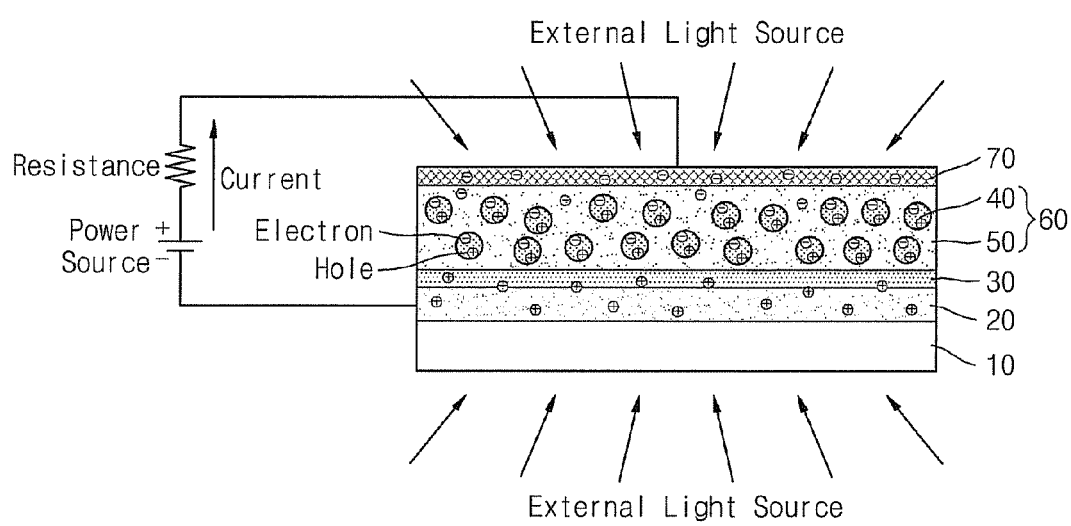

When an external light source is applied like in FIG. 13, a current may flow as shown in FIG. 11. Electro-hole pairs may be generated in the nanoparticles 40 by the external light source. The electrons generated in the nanoparticles 40 may move to the top electrode 70 connected to the positive terminal through the polymer thin film 50, and the holes may move to the bottom electrode 20 connected to the negative terminal through the polymer thin film 50 and a hole transfer layer 30. The excess carriers by the electron-hole pairs may allow a current to flow in the photodetector. Also, the resistance of the photodetector may be lowered, and the photodetector may enter on-state.

On the other hand, since there is an electromotive force by electrons and holes moving to each electrode, the electronic device 100 may be implemented in a solar cell to serve as a power source when generation efficiency of the electron-hole pairs is high. However, example embodiments are not limited thereto and the electronic device according to example embodiments may be implemented in memory devices and/or light emitting devices in addition to the solar cells described above.

For example, when the electronic device 100 of FIG. 1 is used in memory devices, a state that electrons are not captured in nanoparticles 40 may be defined as '1'. In contrast, a state that electrons are captured in nanoparticles 40 may be defined as '0', and vice versa. A read voltage $V_p$ may be applied to perform a read operation in the state of '1'. The read voltage may not be fixed, and a voltage when on/off ratio ($I_{ON}/I_{O\Phi\Phi}$) of current is the largest may be determined as a read voltage. A write voltage $V_\Omega$ may be applied for write operation. The device may be converted from the state of '1' to the state of '0'. In this case, electrons may be injected from the top electrode 70 to nanoparticles 40. The injected electrons may be captured in the nanoparticles 40. An electron captured in the nanoparticles 40 may generate an internal electric field having an opposite direction with respect to the top electrode 70. Accordingly, due to reduction of electron injection efficiency from the top electrode 70, the current flowing in the state of '0' may be reduced to $I_{O\Phi\Phi}$ in the read voltage. A driving circuit may determine the memory state of the device by sensing such a current difference. For erase operation, an erase voltage VE may be applied to the device. In this case, the electrons captured in the nanoparticles 40 may be emitted to the top electrode 70. Accordingly, since the internal electric field by the electrons may be reduced, and the electron injection efficiency may be increased again, the device may return to the state of '1'.

Also, when the electronic device 100 of FIG. 1 is configured with light emitting devices, a positive (+) voltage may be applied to the bottom electrode 20, and a negative (−) voltage may be applied to the top electrode 70. The holes injected from the bottom electrode 20 may pass through the polymer thin film 50, and may be captured in the nanoparticles 40 formed in the polymer thin film 50. The electrons and holes injected from the both electrodes 20 and 70 may be captured in the nanoparticles 40, respectively, and electron-hole recombination may occur therein. As a result of recombination, light may be emitted through the bottom electrode 20 and the substrate 10. The emitted light may have a wavelength corresponding to energy of the forbidden band of the nanoparticles 40 formed in the polymer thin film 50.

According to example embodiments, superior electrical performance can be achieved as electronic device have graphene electrodes. Particularly, since the graphene electrodes are formed by attaching graphene thin films of a sheet shape to polymer thin films, deterioration of the polymer thin films does not occur, thereby improving the performance of the devices.

The graphene thin film can be formed by a joule heating method of heating a graphite metal layer by a heat transport effect when a current flows in at least one of the graphite metal layer and a substrate. Since an electrical field formed by the flowing current may increase the particle size of the graphite metal layer to make the surface thereof very even, a higher quality of graphene thin film can be obtained.

When using the joule heating method, a caloric value according to the control of the amount of current can be controlled in the final cooling process. Accordingly, cooling can be performed at a desired cooling rate. This is the most important factor in controlling the quality of the formed graphene. Also, since a method of directly heating a substrate by the joule heating, instead of indirectly heating a substrate using a resistance heater or a radiant heat of a lamp, is used, modification of a heater design is not required, and therefore it is scalable to wide areas.

In a method for manufacturing an electronic device according example embodiments, nanoparticles can be formed by a chemical method at a temperature of about 100° C. or less by a process of mixing metal acetate dehydrate and DMF and heat-treating. Accordingly, expensive equipment is not required, and the process is relatively simple. The formed nanoparticles have uniform size and high density. Also, since metal nanoparticles existing in a form of metal acetate dihydrate can be formed, the types of the nanoparticles and applications thereof are various. When the formed nanoparticles and the polymer material are mixed, and formed in a thin film through spin-coating, a process of manufacturing a memory layer, a photovoltaic layer, or a light emitting layer using the polymer thin film including the nanoparticles can be considerably simplified.

Since a graphene thin film of a sheet shape is used as electrodes on the formed polymer thin film instead of metal electrodes, deterioration of the electrical characteristics caused by penetration of metal impurities generated during a metal deposition process for forming electrodes and a polymer thin film damage by a high temperature process can be minimized, thereby minimizing deterioration of the performance of the devices formed.

Also, electrodes can be aimed only by attaching graphene thin films onto polymer thin films, which can be performed by van der Waals forces without a separate process. Accordingly, there is no damage to polymer thin films in organic/inorganic hybrid composites used in devices like a memory layer, a photovoltaic layer, or a light emitting layer. Since the graphene electrodes have high adhesive strength, the electronic devices have high mechanical strength.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method for manufacturing an electronic device, comprising:
    forming a graphene thin film of a sheet shape by graphene deposition using a vapor carbon supply source, and a $SiO_2$ substrate including a graphite metal layer, wherein the graphite metal layer includes a graphite metal catalyst, and wherein the graphite metal catalyst includes at least one metal or alloy selected from the group consisting of Ni, Co, Fe, Pt, Au, Al, Cr, Cu, Mg, Mn, Mo, Rh, Si, Ta, Ti, W, U, V, and Zr;
    preparing a polymer solution with distributed nanoparticles;
    spin-coating the polymer solution with distributed nanoparticles on a substrate;
    forming a polymer thin film including the nanoparticles by drying the spin-coated polymer solution, wherein the polymer thin film includes at least one selected from polyvinyl pyrrolidone (PVP), polystyrene (PS), polymethyl methacrylate (PMMA), poly-N-vinylcarbazole (PVK) and polyimide (PI);
    attaching the graphene thin film to the polymer thin film;
    patterning the graphene thin film to define a third region between a first region and a second region; and
    removing the third region to form a first electrode corresponding to the first region and a second electrode corresponding to the second region, the first and second electrodes being substantially coplanar relative to the polymer thin film including the nanoparticles.

2. The method of claim 1, wherein forming the graphene thin film comprises:
    depositing graphene on the $SiO_2$ substrate; and
    separating the $SiO_2$ substrate and the graphene.

3. The method of claim 1, wherein forming the graphene thin film comprises:
    placing the $SiO_2$ substrate including the graphite metal layer formed thereon in a chamber;
    heating the graphite metal layer by a heat transport effect when current flows in at least one of the graphite metal layer and the $SiO_2$ substrate in the chamber;
    depositing carbon ingredients on the graphite metal layer by supplying a vapor carbon supply source in the chamber when the graphite metal layer is heated;
    extracting graphene from the deposited carbon ingredients to a surface of the graphite metal layer by cooling the graphite metal layer at a controlled rate by adjusting the amount of current; and
    separating the extracted graphene from the $SiO_2$ substrate by removing the graphite metal layer by an acid treatment.

4. A method for manufacturing an electronic device, comprising:
    forming a graphene thin film of a sheet shape by graphene deposition using a vapor carbon supply source;
    preparing a polymer solution with distributed nanoparticles;
    spin-coating the polymer solution with distributed nanoparticles on a substrate;
    forming a polymer thin film including the nanoparticles by drying the spin-coated polymer solution, wherein the polymer thin film includes at least one selected from polyvinyl pyrrolidone (PVP), polystyrene (PS), polymethyl methacrylate (PMMA), poly-N-vinylcarbazole (PVK) and polyimide (PI); and
    forming a top electrode by attaching the graphene thin film directly on the polymer thin film by,
        patterning the graphene thin film to define a third region between a first region and a second region, and
        removing the third region to form a first electrode corresponding to the first region and a second electrode corresponding to the second region, the first and second electrodes begin substantially coplanar relative to the polymer thin film including the nanoparticles.

5. The method of claim 2, wherein depositing the graphene on the $SiO_2$ substrate comprises:
    supplying a $CH_4$ gas and a mixture of hydrogen and argon on the $SiO_2$ substrate with Ni.

6. The method of claim 5, wherein, in the separating of the $SiO_2$ substrate and the graphene, graphene is extracted in a thin film form by sequentially dipping the $SiO_2$ substrate deposited with the graphene in an HF solution and a Ni etchant, and etching $SiO_2$ and Ni.

7. The method of claim 1, wherein preparing the polymer solution with distributed nanoparticles comprises:
    forming a mixed solution by dissolving metal acetate dehydrate in N, N-Dimethylformamide (DMF);
    forming nanoparticles by reducing heating temperature after the mixed solution is heated; and
    forming a polymer solution by mixing a polymer material in the mixed solution including the nanoparticles.

8. The method of claim 7, wherein the metal acetate dihydrate is a compound expressed as $M(CH_3COO)_2 \cdot 2H_2O$, M being a metal and being one of Zn, Al, Ba, Bi, Ca, Ce, Cr, Fe, Ga, In, Li, Co, Mg, Mn, Nb, Pb, Sb, Sn, Sr, Ta, Ti, V, W, and Zr.

9. The method of claim 7, wherein the nanoparticles are one of ZnO, CuO, $BaCO_3$, $Bi_2O_3$, $CaCO_3$, $CeO_2$, $Cr_2O_3$, $Fe_2O_3$, $Ga_2O_3$, $In_2O_3$, $Li_2CO_3$,
$LiCoO_2$, MgO, $MnCO_3$, MnO2, $Mn_3O_4$, $Nb_2O_5$, PbO, $Sb_2O_3$, $SnO_2$, $SrCO_3$, Ta2O5, $TiO_2$, $BaTiO_3$, $V_2O_5$, $WO_3$, and $ZrO_2$.

10. The method of claim 1, wherein the substrate is a glass substrate, and further comprising:
forming a bottom electrode including Indium Tin Oxide (ITO) on the glass substrate,
wherein the nanoparticles includes ZnO, and
the polymer thin film includes poly-N-vinylcarbazole (PVK).

11. The method of claim 3, wherein the vapor carbon supply source comprises a $CH_4$ gas.

12. The method of claim 3, wherein hydrogen is further supplied along with the vapor carbon supply source.

13. The method of claim 3, wherein a heating temperature of the graphite metal layer ranges from about 600° C. to about 1,000° C. while the vapor carbon supply source is supplied.

14. The method of claim 3, wherein a cooling speed of the graphite metal layer ranges from about 1° C. to about 50° C. per second while the graphene is extracted.

15. The method of claim 4, wherein forming the graphene thin film comprises:
depositing graphene on a $SiO_2$ substrate; and
separating the $SiO_2$ substrate and the graphene.

16. The method of claim 4, wherein preparing the polymer solution with distributed nanoparticles comprises:
forming a mixed solution by dissolving metal acetate dihydrate in N, N-Dimethylformamide (DMF);
forming nanoparticles by reducing heating temperature after the mixed solution is heated; and
forming a polymer solution by mixing a polymer material in the mixed solution including the nanoparticles.

17. The method of claim 4, wherein the substrate is a glass substrate, and further comprising:
forming a bottom electrode including Indium Tin Oxide (ITO) on the glass substrate,
wherein the nanoparticles includes ZnO, and
the polymer thin film includes poly-N-vinylcarbazole (PVK).

18. The method of claim 4, wherein forming the graphene thin film comprises:
placing a $SiO_2$ substrate including a graphite metal layer formed thereon in a chamber;
heating the graphite metal layer by a heat transport effect when current flows in at least one of the graphite metal layer and the $SiO_2$ substrate in the chamber;
depositing carbon ingredients on the graphite metal layer by supplying a vapor carbon supply source in the chamber when the graphite metal layer is heated;
extracting graphene from the deposited carbon ingredients to a surface of the graphite metal layer by cooling the graphite metal layer at a controlled rate by adjusting the amount of current; and
separating the extracted graphene from the $SiO_2$ substrate by removing the graphite metal layer by an acid treatment.

* * * * *